United States Patent
Chen et al.

(10) Patent No.: US 10,157,789 B2
(45) Date of Patent: Dec. 18, 2018

(54) VIA FORMATION USING SIDEWALL IMAGE TRANSFER PROCESS TO DEFINE LATERAL DIMENSION

(71) Applicants: International Business Machines Corporation, Armonk, NY (US); GLOBALFOUNDRIES, INC., Grand Cayman Islands (KY); STMicroelectronics, Inc., Coppell, TX (US)

(72) Inventors: Shyng-Tsong Chen, Rensselaer, NY (US); Cheng Chi, Jersey City, NJ (US); Chi-Chun Liu, Altamont, NY (US); Sylvie M. Mignot, Slingerlands, NY (US); Yann A. Mignot, Slingerlands, NY (US); Hosadurga K. Shobha, Niskayuna, NY (US); Terry A. Spooner, Clifton Park, NY (US); Wenhui Wang, Clifton Park, NY (US); Yongan Xu, Niskayuna, NY (US)

(73) Assignees: International Business Machines Corporation, Armonk, NY (US); GLOBALFOUNDRIES, INC., Grand Cayman Islands, KS (US); STMicroelectronics, Inc., Coppell, TX (US)

( * ) Notice: Subject to any disclaimer, the term of this patent is extended or adjusted under 35 U.S.C. 154(b) by 0 days.

(21) Appl. No.: 15/239,178

(22) Filed: Aug. 17, 2016

(65) Prior Publication Data

US 2016/0358820 A1   Dec. 8, 2016

Related U.S. Application Data

(62) Division of application No. 14/710,894, filed on May 13, 2015, now Pat. No. 9,490,168.

(51) Int. Cl.
  *H01L 21/768* (2006.01)
  *H01L 23/485* (2006.01)
  (Continued)

(52) U.S. Cl.
  CPC .. *H01L 21/76897* (2013.01); *H01L 21/76802* (2013.01); *H01L 21/76811* (2013.01);
  (Continued)

(58) Field of Classification Search
  None
  See application file for complete search history.

(56) References Cited

U.S. PATENT DOCUMENTS 5,891,799 A   4/1999 Tsui
6,015,751 A   1/2000 Liu
(Continued)

FOREIGN PATENT DOCUMENTS

WO   2007024300 A2   3/2007

OTHER PUBLICATIONS

Aoi et al., "A Novel Clustered Hard Mask Technology for Dual Damascene Multilevel Interconnects with Self-Aligned Via Formation Using an Organic Low k Dielectric," 1999, 2 pages.
(Continued)

*Primary Examiner* — Long Pham
(74) *Attorney, Agent, or Firm* — Steven J. Meyers; Hoffman Warnick LLC

(57) ABSTRACT

A method of forming a via to an underlying layer of a semiconductor device is provided. The method may include forming a pillar over the underlying layer using a sidewall image transfer process. A dielectric layer is formed over the pillar and the underlying layer; and a via mask patterned over the dielectric layer, the via mask having a mask opening at least partially overlapping the pillar. A via opening is etched in the dielectric layer using the via mask, the mask
(Continued)

opening defining a first lateral dimension of the via opening in a first direction and the pillar defining a second lateral dimension of the via opening in a second direction different than the first direction. The via opening is filled with a conductor to form the via. A semiconductor device and via structure are also provided.

11 Claims, 7 Drawing Sheets

(51) Int. Cl.
  *H01L 23/522* (2006.01)
  *H01L 23/528* (2006.01)
  *H01L 23/532* (2006.01)

(52) U.S. Cl.
  CPC .. *H01L 21/76816* (2013.01); *H01L 21/76829* (2013.01); *H01L 21/76834* (2013.01); *H01L 21/76885* (2013.01); *H01L 23/485* (2013.01); *H01L 23/5226* (2013.01); *H01L 23/5283* (2013.01); *H01L 23/5329* (2013.01); *H01L 23/53238* (2013.01); *H01L 23/53266* (2013.01)

(56) References Cited

U.S. PATENT DOCUMENTS

| | | |
|---|---|---|
| 6,365,504 B1 | 4/2002 | Chien et al. |
| 8,062,971 B2 | 11/2011 | Riess et al. |
| 8,114,306 B2 | 2/2012 | Cheng et al. |
| 8,298,943 B1 | 10/2012 | Arnold et al. |
| 8,394,718 B1 | 3/2013 | Gambino et al. |
| 8,415,248 B2 | 4/2013 | Chen et al. |
| 8,704,343 B2 | 4/2014 | Ponoth et al. |
| 8,803,321 B2 | 8/2014 | Holmes et al. |
| 2009/0087992 A1* | 4/2009 | Srivastava ........ H01L 21/02063 438/701 |
| 2009/0200683 A1 | 8/2009 | Colburn et al. |
| 2009/0206489 A1 | 8/2009 | Li et al. |
| 2015/0179457 A1* | 6/2015 | Hung ................ H01L 21/28008 438/586 |

OTHER PUBLICATIONS

Chen et al., "56 nm Pitch Copper Dual-Damascene Interconnects With Triple Pitch Split Metal and Double Pitch Split Via," 2012, 3 pages.

Li et al., "Creation of sub-20-nm contact using diblock copolymer on a 300 mm wafer for complementary metal oxide semiconductor applications," Journal of Vacuum Science & technology 1325, 1982 (2007), 4 pages.

Liao et al., "A Self-Aligned Via Etch Process to Increase Yield and Reliability of 90 nm Pitch Critical Interconnects with Ultra-thin TiN Hardmask," 4 pages.

Tomizawa et al., "Robust Self-Aligned Via Process for 64nm Pitch Dual-Damascene Interconnects using Pitch Split Double Exposure Patterning Scheme," 3 pages.

Authors et al.: Disclosed Anonymously, "A Structure and Method for bi-directionally self aligned vias (bSAV)," Nov. 23, 2010, 4 pages.

Authors et al.: Disclosed Anonymously, "Bi-Directionally Self Aligned Vias", Sep. 26, 2013, 6 pages.

Pham. Notice of Allowance and Fees Due for U.S. Appl. No. 14/710,894; dated Jul. 20, 2016; 5 pages.

U.S. Appl. No. 14/710,894, Office Action 1 dated Mar. 16, 2016, 18 pages.

* cited by examiner

VIA FORMATION USING SIDEWALL IMAGE TRANSFER PROCESS TO DEFINE LATERAL DIMENSION

BACKGROUND

Technical Field

The present disclosure relates to semiconductor processing, and more specifically, to a method of forming a fully self-aligned via using a sidewall image transfer process to define a lateral dimension of the via.

Related Art

In the microelectronics industry as well as in other industries involving construction of microscopic structures (e.g., micromachines, magnetoresistive heads, etc.) there is a continued desire to reduce the size of structural features and microelectronic devices and/or to provide a greater amount of circuitry for a given chip size. Miniaturization in general allows for increased performance (more processing per clock cycle and less heat generated) at lower power levels and lower cost. Present technology is at atomic level scaling of certain micro-devices such as logic gates, FETs and capacitors, for example. Circuit chips with hundreds of millions of such devices are common.

Sidewall image transfer (SIT), also known as self-aligned double patterning (SADP), is a technique to generate sub-lithographic structures, which aids in the afore-mentioned miniaturization. SIT involves the usage of a sacrificial strum (e.g., a mandrel, typically composed of a polycrystalline silicon or organic material), and a sidewall spacer (such as silicon dioxide or silicon nitride, for example) having a thickness less than that permitted by the current lithographic ground rules formed on the sides of the mandrel (e.g., via oxidization or film deposition and etching). After removal of the mandrel, the remaining sidewall spacer is used as a hard mask (HM) to etch the layer(s) below, for example, with a directional reactive ion etch (RIE). Since the sidewall spacer has a sub-lithographic width (less than lithography allows), the structure formed in the layer below will also have a sub-lithographic width. In SIT processing, the side wall spacer hard mask is either removed during the etching of the underlying layer or removed after the etching.

Circuit chips also include a large number of levels including conductive lines or wires that connect different parts of the chip together. Interconnects couple conductive lines between levels, and are oftentimes referred to as vias or contact vias. One challenge in making interconnects of semiconductor devices in ever-smaller circuit chips is that it is difficult to control the via's width relative to an intended critical dimension (CD). As shown in FIGS. 1 and 2, in widely used 'self-aligned via' (SAV) processing, an opening 8 for a via is constructed by patterning a hard mask 10, e.g., of titanium nitride (TiN) and tetraethyl orthosilicate, $Si(OC_2H_5)_4$(TEOS), over a dielectric layer 12 overlaying a level 14 such as an interconnect level with dielectric and a wire 16, and etching opening 8 into dielectric layer 12 using hard mask 10. FIG. 1 shows opening 8 in a first cross-sectional direction and FIG. 2 shows opening 8 in a second, perpendicular cross-sectional direction. During etching, as observed by comparing FIGS. 1 and 2, hard mask 10 controls an intended critical dimension (CD) in one direction but not in the other direction. For example, as shown in FIG. 1, opening 8 can be confined in an x-direction, perpendicular to a line to which the via is being coupled in an underlying layer, resulting in critical dimension CDx, but, as shown in FIG. 2, the dimension is unconstrained in a y-direction, parallel to wire 16. That is, the resulting hard mask opening in the y-direction cannot control the y-direction dimensions for the vias (2 shown) etched in that direction. This situation results in an unintended, elongated dimension UDy in hard mask 10 for the two vias.

The above problem of improper via dimensioning during fabrication may be caused by a number of self-aligned via processing characteristics. First and foremost, the critical dimension control in the different directions is not maintained outside of the hard mask. In addition, the aspect ratio control of the self-aligned via may also not be controlled leading to improper dimensions. A number of approaches to solving the above problem employ some form of a double exposure via mask to form a bi-directionally aligned via through the dielectric layer. These approaches suffer from a number of drawbacks such as the need for additional masking layers increasing the overlay placement, the need for more precise etching bias control and tuning to control the hard mask critical dimension, and finally, the lack of control of the via placement on the lower interconnect level.

SUMMARY

A first aspect of the disclosure is directed to a method of forming a via to an underlying layer of a semiconductor device, the method comprising the steps of: forming a pillar over the underlying layer using a sidewall image transfer process; forming a dielectric layer over the pillar and the underlying layer; patterning a via mask over the dielectric layer, the via mask having a mask opening at least partially overlapping the pillar; etching a via opening in the dielectric layer using the via mask, the mask opening defining a first lateral dimension of the via opening in a first direction and the pillar defining a second lateral dimension of the via opening in a second direction different than the first direction; and filling the via opening with a conductor to form the via.

A second aspect of the disclosure includes a semiconductor device, comprising: a via including: an elongated conductive body extending through a dielectric layer to an underlying layer; and a pillar on the underlying layer abutting the elongated conductive body to define a lateral dimension of the elongated conductive body.

A third aspect of the disclosure related to a via structure for a semiconductor device, the via structure comprising: an elongated conductive body extending through a dielectric layer to an underlying layer; and a pair of spaced pillars on the underlying layer, each pillar abutting the elongated conductive body to define a lateral dimension of the elongated body.

The foregoing and other features of the disclosure will be apparent from the following more particular description of embodiments of the disclosure.

BRIEF DESCRIPTION OF THE DRAWINGS

The embodiments of this disclosure will be described in detail, with reference to the following figures, wherein like designations denote like elements, and wherein.

DETAILED DESCRIPTION

Figure 1:
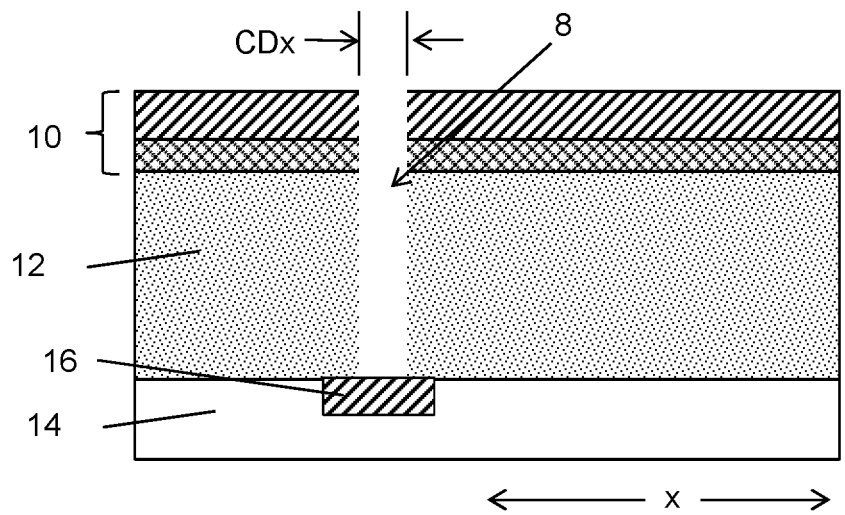
FIG. 1 shows a cross-sectional view of a conventional via opening.
Figure 2:
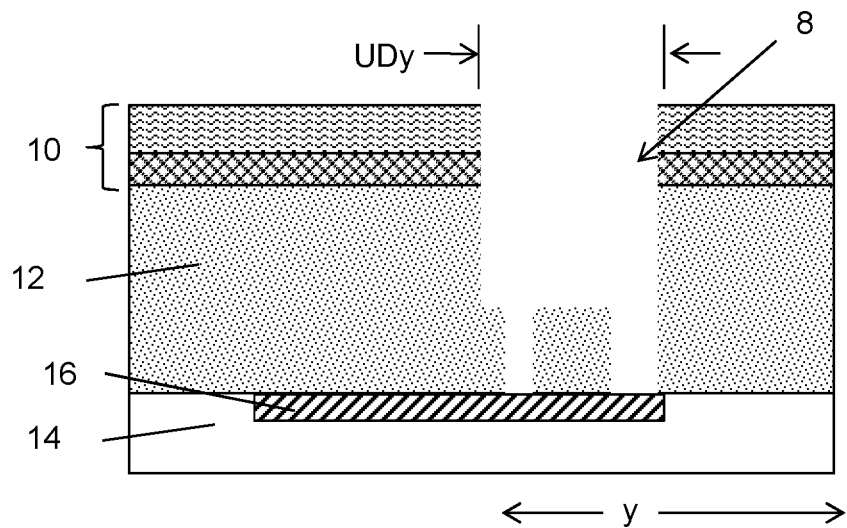
FIG. 2 shows another cross-sectional view of a conventional via opening.

Referring to the drawings, a method of forming a via according to embodiments of the disclosure is disclosed, along with embodiments of a semiconductor device and a via structure. As will be described, embodiments of the disclosure employ a SIT process to form a pillar that acts to define a lateral dimension of a via in a direction not well controlled by a via mask, thus providing improved via critical dimension control.

Figure 3:
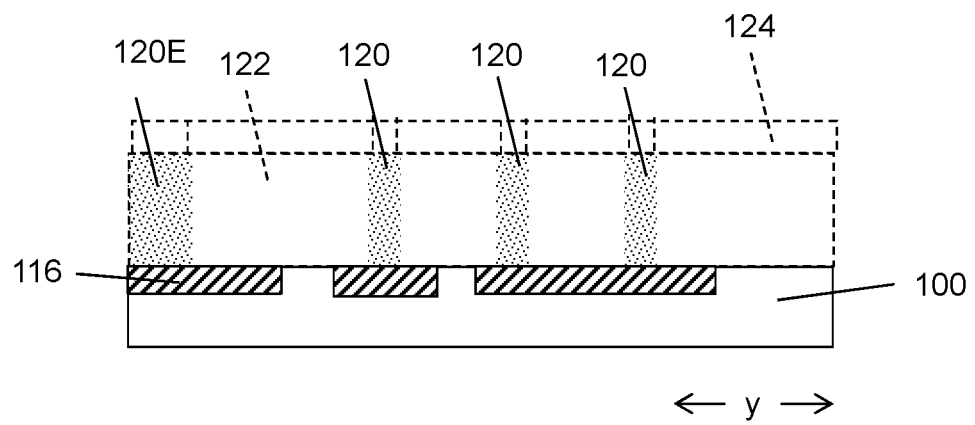
FIGS. 3-7 show cross-sectional views of a SIT process to form a pillar according to embodiments of the disclosure.

As shown in FIG. 3, a method may originate with an underlying layer 100. Underlying layer 100 may include any layer of a semiconductor device to which a via is to be provided. In one embodiment, underlying layer 100 may include a semiconductor layer. The semiconductor material may include any now known or later developed semiconductor material including but not limited to silicon, germanium, silicon germanium, silicon carbide, and those consisting essentially of one or more III-V compound semiconductors having a composition defined by the formula $Al_{X1}Ga_{X2}In_{X3}As_{Y1}P_{Y2}N_{Y3}Sb_{Y4}$, where X1, X2, X3, Y1, Y2, Y3, and Y4 represent relative proportions, each greater than or equal to zero and X1+X2+X3+Y1+Y2+Y3+Y4=1 (1 being the total relative mole quantity). Other suitable substrates include II-VI compound semiconductors having a composition $Zn_{A1}Cd_{A2}Se_{B1}Te_{B2}$, where A1, A2, B1, and B2 are relative proportions each greater than or equal to zero and A1+A2+B1+B2=1 (1 being a total mole quantity). If underlying layer 100 is provided as a semiconductor layer, the layer may be part of a bulk silicon substrate or a semiconductor-on-insulator substrate. Furthermore, a portion or entire semiconductor layer/substrate may be strained. In addition, a location to which a via is provided may be doped, e.g., as a source or drain, in any now known or later developed manner. In alternative embodiment, underlying layer 100 may include a dielectric layer over another material, e.g., a metal or polysilicon gate, a back-end-of-line (BEOL) metal layer, etc. In the latter case, the BEOL metal layer may include any metal layer of the semiconductor device following a first metallization. If underlying layer 100 is a dielectric layer, the layer may include any now known or later developed dielectric material such as but not limited to silicon oxide ($SiO_2$), fluorinated $SiO_2$ (FSG), low k dielectrics like hydrogenated silicon oxycarbide (SiCOH), porous SiCOH, other ultra low k (ULK) based on SiCOH with dielectric constant <2.7. This underlying layer 100 may also include a cap layer below the dielectric layer which may include but is not limited to silicon nitride ($Si_3N_4$), silicon oxy-nitride (SiON), nitrogen doped silicon cardide (SiCN), etc. In another example, and as shown, underlying layer 100 may include a metal level of a semiconductor device and may include a functional semiconductor component to which a via may be required, e.g., a wire, resistor, source/drain region or any other functional semiconductor component. In the example illustrated and for purposes of description, the functional semiconductor component is illustrated as a wire or line 116. Line 116 may be conductive and has a length that runs in a y-direction as indicated in some of the drawings.

FIGS. 3-8 show forming a pillar 110 (FIG. 7) over underlying layer 100 using a sidewall image transfer (SIT) process. FIGS. 3-8 show cross-sectional views in what will be referred to herein as a second direction, denoted as a y-direction, parallel to line 116 in underlying layer 100. A first direction (see e.g., FIGS. 1, 8, 9, 11), denoted as an x-direction, is substantially perpendicular to second direction, and runs perpendicular to line 116. As shown, line 116 runs into/out of the page in the x-direction cross-sectional views, and across the page in the y-direction cross-sectional views. In one embodiment, the SIT process may include forming a mandrel 120 over underlying layer 100. While the figures show a number of mandrels 120, the description will proceed describing a single mandrel except where necessary, for clarity. The mandrel forming may include any now known or later developed process. In one example, the mandrel forming may include depositing a mandrel layer (122 shown in phantom in FIG. 3) over underlying layer 100. Mandrel layer 122 may include any now known or later developed sacrificial material used for SIT mandrels. For example, mandrel layer 122 may include a photoresist, titanium nitride (TiN), an organic planarizing layer (OPL), polycrystalline silicon or a nitride. In terms of an OPL, the layer may include any organic self-planarizing polymer. The material of the organic planarization layer could be, but is not limited to, ODL-102 or ODL-401 which is commercially available from Shin-Etsu Chemical Co., Ltd., or JSRHM8833, which is commercially available from JSR Corporation. The material of the organic planarization layer could also be, but is not limited to, a hydrocarbon component of greater than 75% and less than 90% by weight with the remaining components comprising a combination of oxygen with hydrogen, and nitrogen of greater than 5% and less than 20% by weight.

Mandrel layer 122 may be deposited on underlaying layer 100. "Depositing," as used herein, may include any now known or later developed techniques appropriate for the material to be deposited including but are not limited to, for example: chemical vapor deposition (CVD), low-pressure CVD (LPCVD), plasma-enhanced CVD (PECVD), semi-atmosphere CVD (SACVD) and high density plasma CVD (HDPCVD), rapid thermal CVD (RTCVD), ultra-high vacuum CVD (UHVCVD), limited reaction processing CVD (LRPCVD), metalorganic CVD (MOCVD), sputtering deposition, ion beam deposition, electron beam deposition, laser assisted deposition, thermal oxidation, thermal nitridation, spin-on methods, physical vapor deposition (PVD), atomic layer deposition (ALD), chemical oxidation, molecular beam epitaxy (MBE), plating, or evaporation.

A mandrel mask 124 (shown in phantom in FIG. 3) may be patterned in a conventional manner over mandrel layer 122. Mandrel mask 124 has an inverted pattern compared to a via mask 148 (FIGS. 9-14) used to form the via, as described herein. That is, mandrel mask 124 is an inversion of the via mask. Mandrel layer 122 is then etched using mandrel mask 124 to form mandrel 120. The etch may include any appropriate etch for the mandrel layer material used, e.g., a reactive ion etch (RIE), wet diluted hydrofluoric (DHF) acid, etc. Most mandrels 120 are shown in the middle of underlying layer 124; however, it may also advantageous to form an edge mandrel 120E near or at an edge of underlying layer 100.

Figure 4:
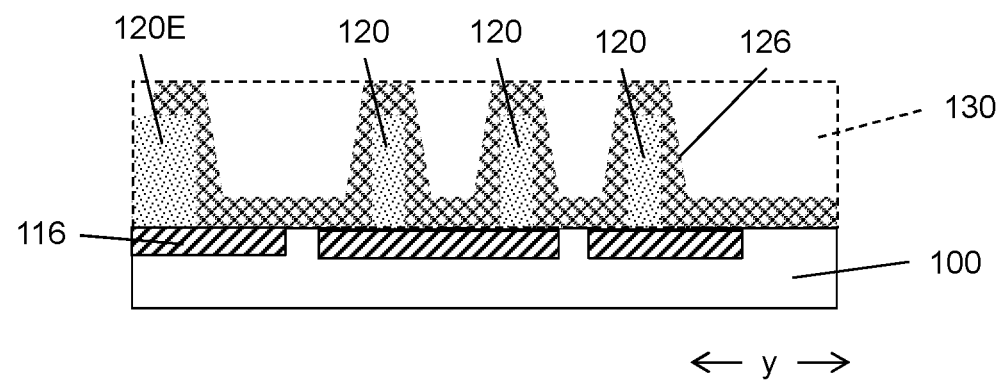

FIG. 4 shows depositing a spacer layer 126 over mandrel 120. Spacer layer 126 may include any spacer material compatible with the integration scheme. In particular, as will become apparently, spacer material 126 is not removed, and thus needs to be compatible with surrounding structure, e.g., an interlevel dielectric (ILD) layer thereover, underlying layer 100, etc. Spacer layer 126 may include, for example, a cap layer material such as a nitride such as silicon nitride ($Si_3N_4$), silicon carbon nitride (SiCN), silicon oxynitride (SiON) or oxygen doped silicon carbide (SiCNO), etc.; an interlevel dielectric (ILD) material such as an oxide such as silicon oxide ($SiO_2$); or a carbon doped silicon oxide graded layer. Other ULK materials may include SiCOH -based materials with a dielectric constant in the range 3.0 to 1.8. In any event, pursuant to SIT processes, spacer layer 126 may have a thickness of 5 nanometers (nm) to 25 nm.

Figure 5:
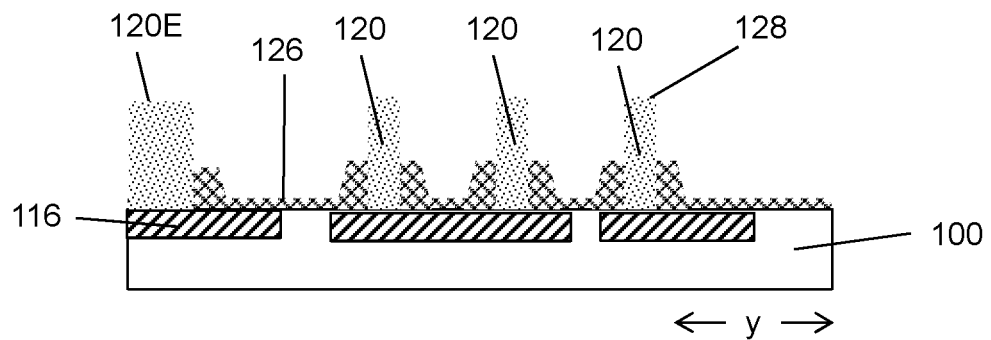
Figure 6:
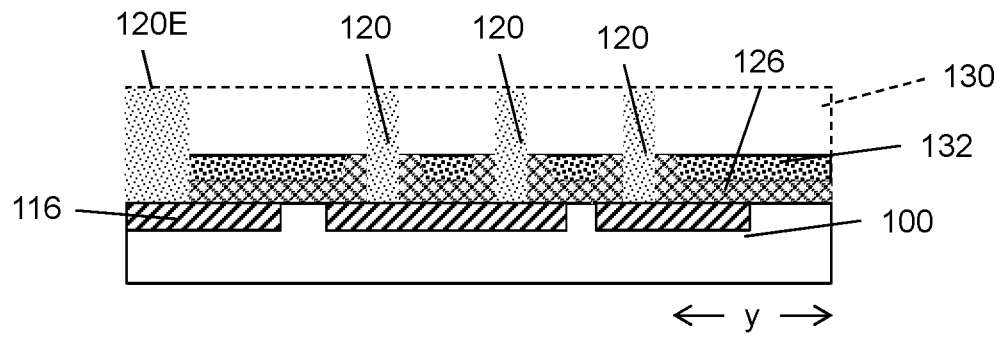

FIG. 5 shows exposing an upper surface 128 (and perhaps sidewalls) of mandrel 120. The exposure is typically carried out with an etching process such as RIE, and is commonly referred to as spacer etch back (SEB) in SIT processes. The exposure opens mandrel 120 and thins spacer layer 126. The remaining horizontal thickness of layer 126 will be between 0 nanometers (nm) to 15 nm depending, first, on the initial deposited thickness of layer 126 (e.g., from 5 to 15 nm), and second, on the integration requirement. FIG. 6 shows an alternative embodiment in which an organic planarizing layer (OPL) 130 (shown in phantom) is deposited prior to the spacer etch back. In this case, the exposing of mandrel 120 includes an OPL etch followed by spacer etch back, resulting in OPL layer 132 as shown. Here, OPL layer 132 maintains horizontal spacer layer 126 thickness as deposited over underlying layer 100, e.g., between mandrels 120. A vertical height of spacer layer 126 exposed by OPL layer 132 will be reduced. The OPL may be removed using, for example, either oxygen ($O_2$), a nitrogen ($N_2$)/hydrogen ($H_2$) mixture, or a carbon monoxide (CO)/carbon dioxide ($CO_2$) mixture in a reactive ion plasma etch process, which techniques are well known by those of ordinary skill in the art. Although spacer layer 126 may be removed in some instances between mandrels 120, the subsequent figures shall show it as being present.

Figure 7:
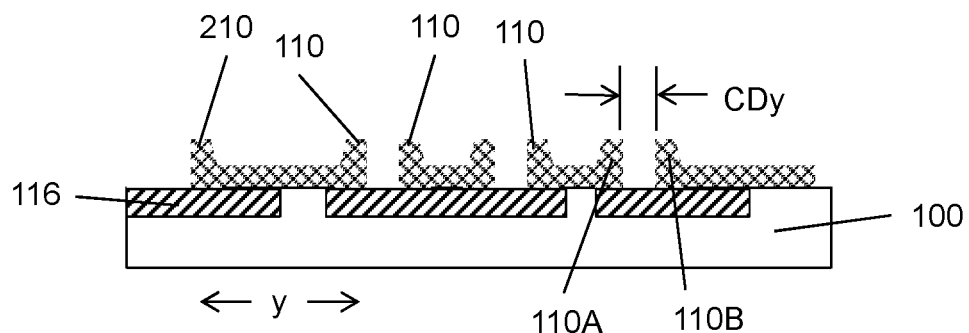
Figure 8:
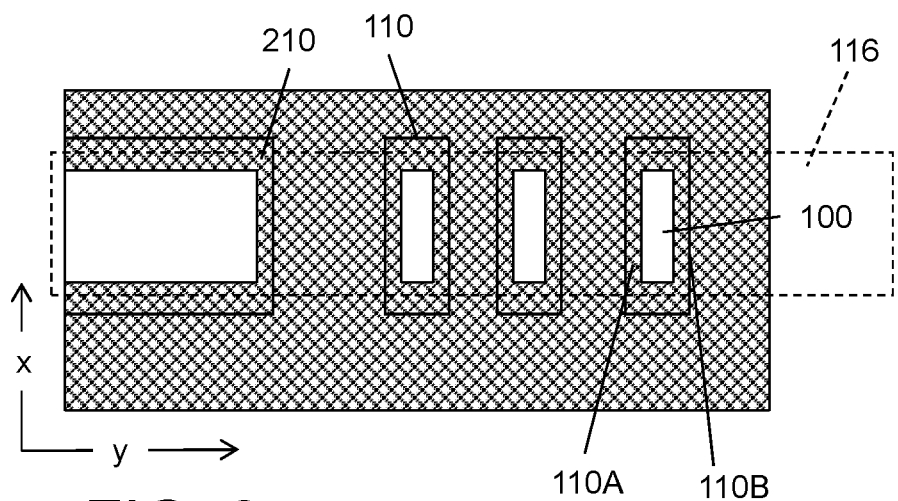
FIG. 8 shows a plan view of a number of pillars formed according to embodiments of the disclosure.

FIG. 7 shows removing mandrel(s) 120 (FIG. 6) to form pillar(s) 110, 210 from spacer layer 126 (FIGS. 5 and 6). At this stage, pillar 110, 210 may have a thickness of 5 nanometers (nm) to 15 nm. The format of the etch used to remove mandrel(s) 120 (FIG. 6) can vary depending on the mandrel material. For example, a dry etch may be employed for the materials such as a RIE or $Cl_x$ based chemistry for TiN. A few of the materials can also be removed by wet etching without removing other layers. As shown in FIG. 7, the mandrel removal may result in a single pillar 210 (by itself with no opposing pillar), and/or may result in a pair of pillars 110A, 110B having a predefined spacing ($CD_y$) there between. Any number of single pillars 210 and pairs of pillars 110A, 110B may be generated to define a lateral dimension of any number of vias. FIG. 7 shows a cross-sectional view and FIG. 8 shows a plan view of pillar(s) 110, 210 that are employed to define a lateral dimension, i.e., sideways on page, of a via. Paired pillars 110 are in the middle of underlying layer 100 and single pillar 210 is near an edge of underlying layer 100. As will be described herein, pillar(s) 110, 210 will be used to define and/or constrain a lateral dimension of a via having its via opening formed thereover.

Figure 9:
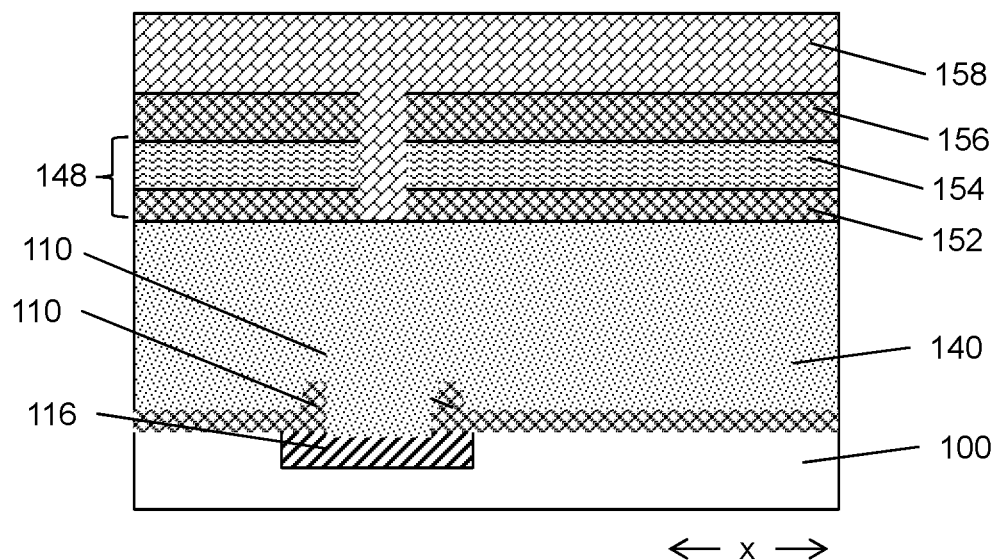
FIGS. 9 and 10 show two cross-sectional views of a dielectric layer and a via mask over pillar(s) formed according to embodiments of the disclosure.
Figure 10:
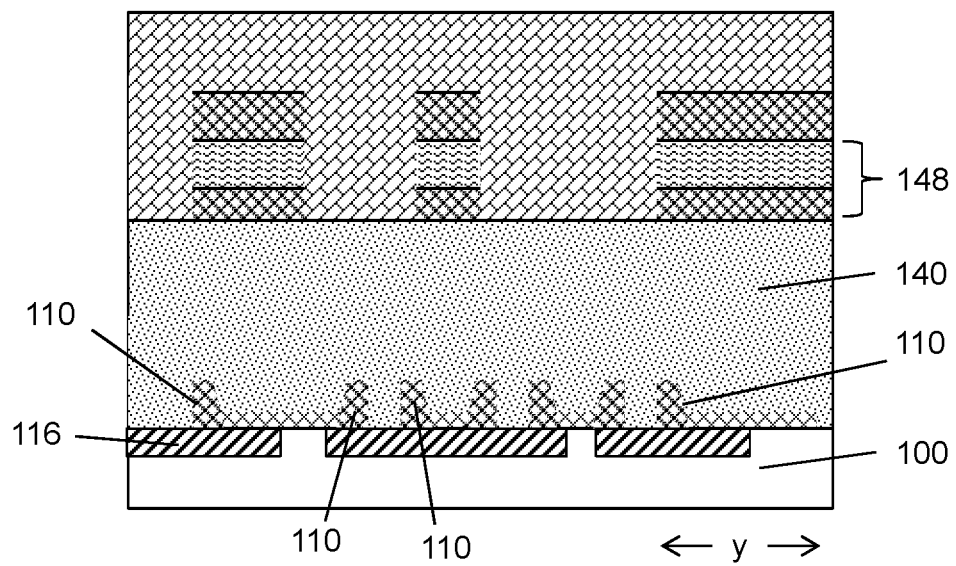

FIG. 9 shows a cross-sectional view in a first direction, denoted as the x-direction, perpendicular to line 116 in underlying layer 100 to which a via is being coupled, and FIG. 10 shows a cross-sectional view in a second, different direction, denoted as y-direction, parallel to a line(s) 116 in underlying layer 100. The alternating x, y direction convention of FIGS. 9 and 10 continues in FIGS. 12 and 13. In FIGS. 9 and 10, a dielectric layer 140 is formed over pillar(s) 110, 210 and underlying layer 100. Dielectric layer 140 material may include, for example, silicon oxide $Si_{O2}$. However, dielectric layer 140 may include any interlayer dielectric such as but not limited to: silicon nitride ($Si_3N_4$), silicon oxide ($SiO_2$), fluorinated $SiO_2$ (FSG), and low k dielectrics like hydrogenated silicon oxycarbide (SiCOH), porous SiCOH, boro-phospho-silicate glass (BPSG), silsesquioxanes, carbon (C) doped oxides (i.e., organosilicates) that include atoms of silicon (Si), carbon (C), oxygen (O), and/or hydrogen (H), thermosetting polyarylene ethers, SiLK (a polyarylene ether available from Dow Chemical Corporation), a spin-on silicon-carbon containing polymer material available from JSR Corporation, other ultra-low k (ULK) based on SiCOH with low dielectric constant (k <2.7) material, or layers thereof. The precise thickness of dielectric layer 140 may vary widely with the intended application.

Figure 11:
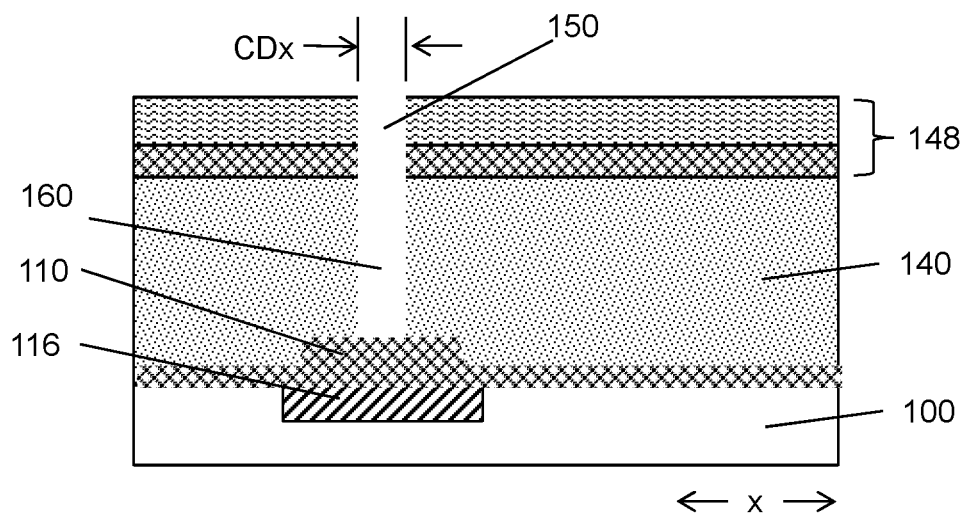
FIGS. 11 and 12 show two cross-sectional views of forming a via opening using a pillar(s) according to embodiments of the disclosure.
Figure 12:
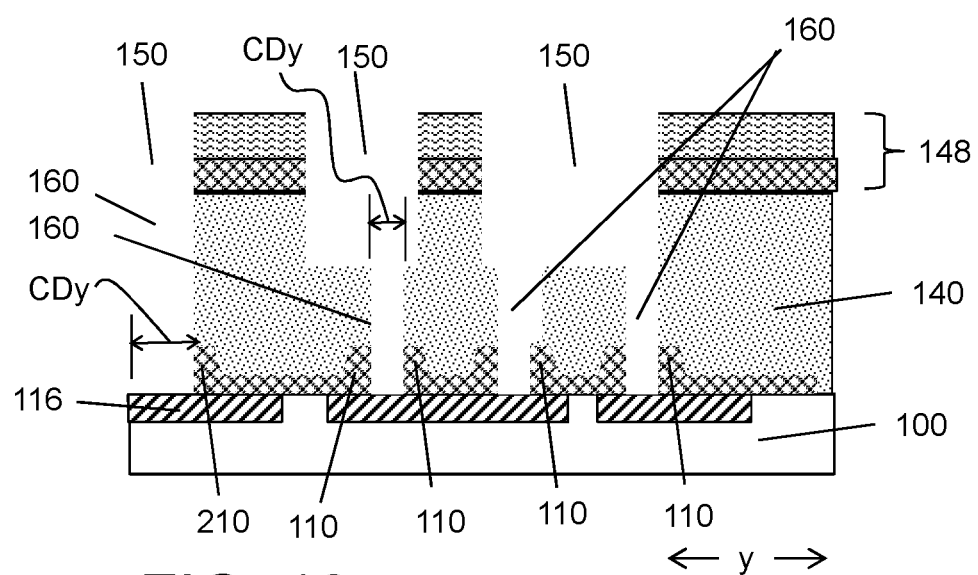

FIGS. 9 and 10 also show patterning a via mask 148 over dielectric layer 140. As shown in FIGS. 11 and 12, via mask 148 includes a mask opening 150 (3 shown) at least partially overlapping a pillar 110 or 210. Via mask 148 patterning may include any now known or later developed mask formation. In one example, as shown in FIG. 9, the via mask patterning may include depositing a first hard mask layer 152 such as tetraethyl orthosilicate, $Si(OC_2H_5)_4$ (TEOS) or other hard mask material, a second hard mask layer 154 such as titanium nitride (TiN), a litho-etch-litho-etch-litho-etch (LELELE) or SIT hard mask 156, and then patterning layers 152, 154, 156. As illustrated, an OPL 158 may then be deposited. As will be apparent, different layers may be removed prior to use of via mask 148. While particular types of masking material have been listed, a wide variety of masks may be employed. As shown in FIG. 11, as is conventional, mask opening 150 of via mask 148 defines a first lateral dimension $CD_x$ of via opening 160 in a first direction, indicated as the x-direction perpendicular to line 116.

FIGS. 11 and 12 show etching a via opening 160 in dielectric layer 140 using via mask 148. Here, in contrast to conventional processing, a pillar(s) 110, 210 defines a second lateral dimension $CD_y$ (2 shown) of via opening 160 in a second direction (e.g., y-direction) different than the first direction (e.g., x-direction). In this fashion, a bi-directionally controlled via opening 160 can be formed. FIG. 11 shows a cross-sectional view of a side of pillar 110 (compare to FIG. 8). While via opening 160 is not controlled at an upper end, pillar 110 act to constrain or define a lateral dimension of the via opening near underlying layer 100, and thus controls a lateral dimension of an elongated conductive body 170 (FIGS. 13-15).

Figure 13:
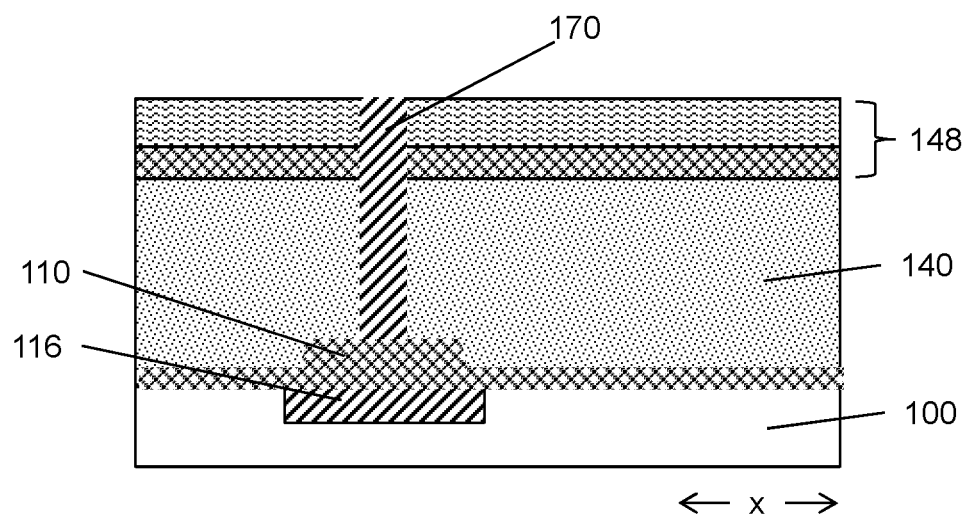
FIGS. 13 and 14 show two cross-sectional views of filling the via opening with a conductor to form a via using a pillar(s) according to embodiments of the disclosure.
Figure 14:
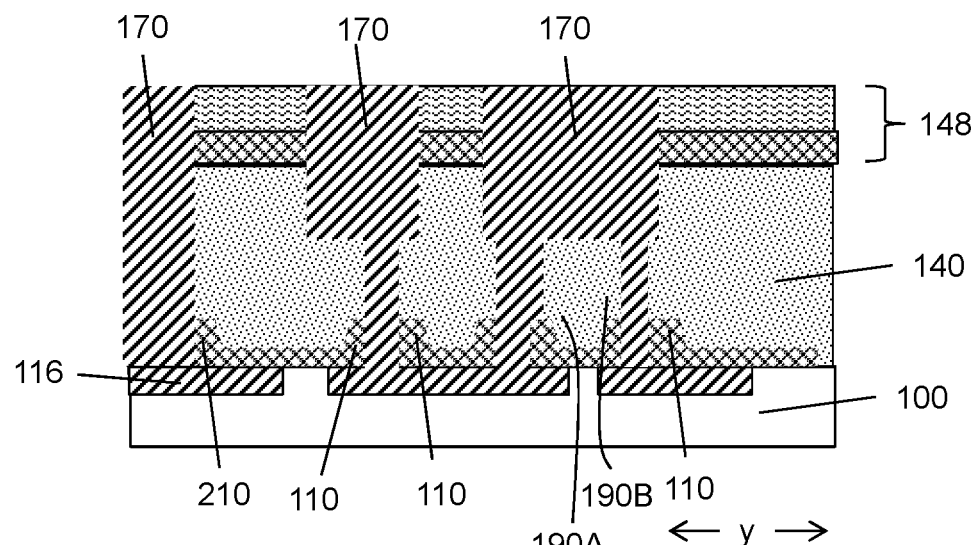

FIGS. 13 and 14 show filling via opening 160 (FIGS. 11-12) with a conductor 170 to form via(s) or via structure(s) 172 (FIGS. 15-16), and a semiconductor device 200 (FIGS. 15-16) according to embodiments of the disclosure. Conductor 170 may also be referred to herein as an elongated conductive body of a via 172. Filling via opening 160 (FIGS. 11-12) may include any now known or later developed via processing. In one example, the process may include: depositing a liner (not shown for clarity) such as a refractory metal liner, e.g., ruthenium, tantalum (Ta), titanium (Ti), tungsten (W), iridium (Ir), rhodium (Rh) and platinum (Pt), etc., or mixtures of thereof. A conductor in the form of a metal, e.g., tungsten (W), copper (Cu), aluminum (Al), etc., may then be deposited in via opening 160, followed by polishing, e.g., chemical-mechanical polishing for surface planarization and definition of metal interconnect patterns.

Figure 15:
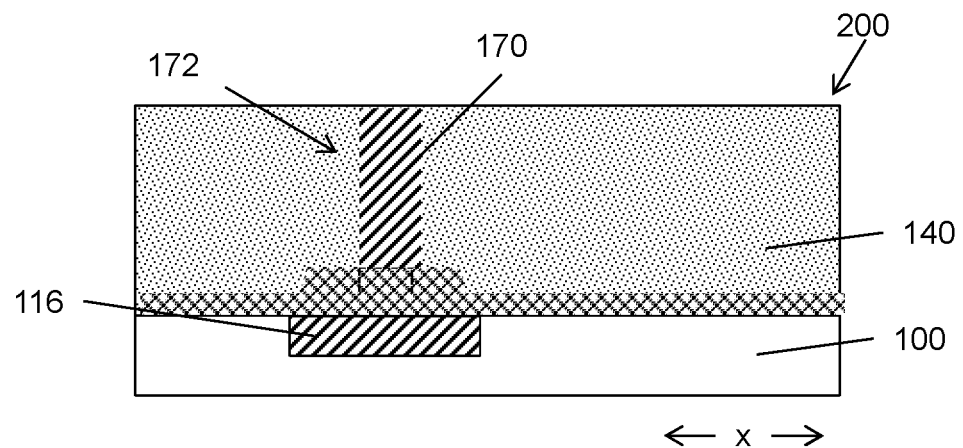
FIGS. 15 and 16 show two cross-sectional views of a semiconductor device and via structure according to embodiments of the disclosure.
Figure 16:
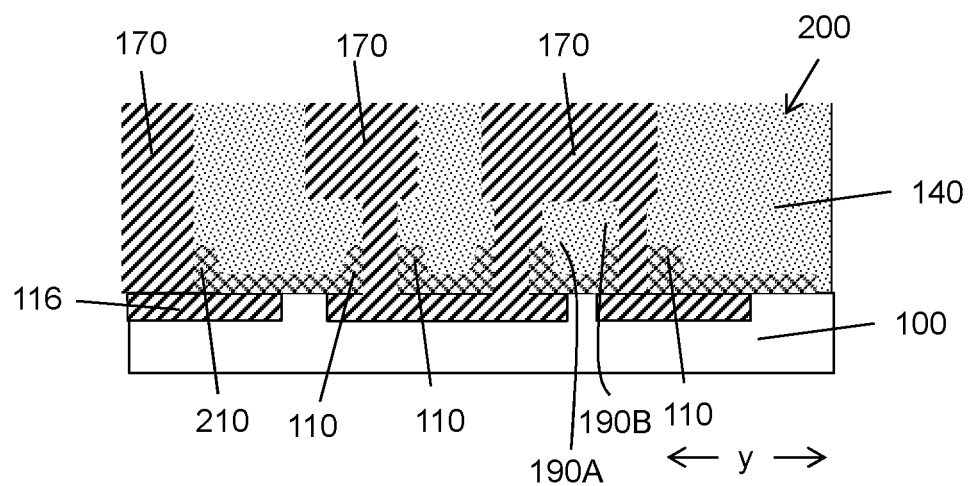

FIGS. 15-16 show processing after removing hard mask 148 using any now known or later developed stripping process, and chemical mechanical polishing to remove excess conductor 170 (also removes part of dielectric layer 140). As shown in FIGS. 15-16, semiconductor device 200 according to embodiments of the disclosure may include a via or via structure 172, including elongated conductive body 170 extending through dielectric layer 140 to underlying layer 100, and a pillar 110, 210 on underlying layer 100 abutting elongated conductive body 170 to define a lateral dimension of the elongated conductive body. The pillar may include a first pillar 110A spaced from a second pillar 110B and having a lower portion of elongated conductive body 170 there between, each pillar defining the lateral dimension of the elongated conductive body. In this case, elongated conductive body 170 may simply abut a sidewall of pillar(s) 110, 210. However, pillar(s) 110, 210 may also control a lateral dimension when elongated conductive body 170 lands on and/or over pillar(s) 110, 210.

A third pillar 210 may be spaced from one of first and second pillars (farthest left 110A, as shown). Each pillar 110, 210 may include a spacer material, as described herein, and third pillar 210 and the one of the first and second pillars (farthest left 110A, as shown) may include a layer 126 of the spacer material therebetween. That is, spacer material layer 126 may remain between pillar 210 and pillar 110A. As also shown, spacer material layer 126 may also be present between adjacent pairs of pillars on underlying layer 100.

Embodiments of the disclosure provide lateral dimension control in two directions providing an accurate bottom via critical dimension and fully self-aligned via (F-SAV) processing. In addition, a small critical dimension can be obtained in line with advancing technology nodes. Further, because pillars 110, 210 are relatively small and do not extend over a majority of an upper surface of underlying layer 100, their resistance and capacitance effective impact for interconnect structure is the same or better than conventional dual-masking processes. Embodiments of the disclosure will also reduce the risk of device shorting by maintaining a stronger space in, as shown in FIG. 14, a via chamfer region 190A and 190B, for example.

The method as described above is used in the fabrication of integrated circuit chips. The resulting integrated circuit chips can be distributed by the fabricator in raw wafer form (that is, as a single wafer that has multiple unpackaged chips), as a bare die, or in a packaged form. In the latter case the chip is mounted in a single chip package (such as a plastic carrier, with leads that are affixed to a motherboard or other higher level carrier) or in a multichip package (such as a ceramic carrier that has either or both surface interconnections or buried interconnections). In any case the chip is then integrated with other chips, discrete circuit elements, and/or other signal processing devices as part of either (a) an intermediate product, such as a motherboard, or (b) an end product. The end product can be any product that includes integrated circuit chips, ranging from toys and other low-end applications to advanced computer products having a display, a keyboard or other input device, and a central processor.

The descriptions of the various embodiments of the present disclosure have been presented for purposes of illustration, but are not intended to be exhaustive or limited to the embodiments disclosed. Many modifications and variations will be apparent to those of ordinary skill in the art without departing from the scope and spirit of the described embodiments. The terminology used herein was chosen to best explain the principles of the embodiments, the practical application or technical improvement over technologies found in the marketplace, or to enable others of ordinary skill in the art to understand the embodiments disclosed herein.

What is claimed is:
1. A semiconductor device, comprising:
   a via including:
      an elongated conductive body extending through a dielectric layer to a conductive wire in an underlying layer, wherein the elongated conductive body splits into at least two prongs above the underlying layer; and
      a first pillar and a second pillar on the underlying layer and above the conductive wire abutting each of the at least two prongs of-the elongated conductive body at a position nearest the underlying layer to define a lateral dimension of the elongated conductive body.
2. The semiconductor device of claim 1, wherein each first pillar is spaced from each second pillar and having a lower portion of the elongated conductive body there between, each pillar defining the lateral dimension of the elongated conductive body.
3. The semiconductor device of claim 2, further comprising a third pillar spaced from one of the first and second pillars, and wherein each pillar includes a spacer material and a layer of the spacer material extending between the third pillar and the one of the first and second pillars.
4. The semiconductor device of claim 3, further comprising an organic planarizing layer (OPL) over the layer of the spacer material.
5. The semiconductor device of claim 1, wherein the pillar has a lateral thickness between 5 nanometers and 15 nanometers.
6. The semiconductor device of claim 1, wherein the pillar has a sub-lithographic lateral dimension.
7. A via structure for a semiconductor device, the via structure comprising:
   an elongated conductive body extending through a dielectric layer to a conductive wire in an underlying layer, wherein the elongated conductive body splits into a prong above the underlying layer; and
   a first pillar and a second on the underlying layer and above the conductive wire abutting each of the at least two prongs of the elongated conductive body at a position nearest the underlying layer to define a lateral dimension of the elongated body.
8. The via structure of claim 7, further comprising a third pillar spaced from one of the first or second pillars, and wherein each pillar includes a spacer material and the third pillar and a layer of the spacer material extending between the third pillar and the one of the first or second pillars.
9. The via structure of claim 8, further comprising an organic planarizing layer (OPL) over the layer of the spacer material.
10. The via structure of claim 7, wherein each pillar has a lateral thickness between 5 nanometers and 15 nanometers.
11. The via structure of claim 7, wherein each pillar has a sub-lithographic dimension.

* * * * *